(12) United States Patent
Chen

(10) Patent No.: US 11,343,937 B2
(45) Date of Patent: May 24, 2022

(54) MODULAR HIGH DENSITY COMMUNICATIONS CHASSIS

(71) Applicant: EZCONN CORPORATION, New Taipei (TW)

(72) Inventor: Szu ming Chen, New Taipei (TW)

(73) Assignee: EZconn Corporation, New Taipei (TW)

( * ) Notice: Subject to any disclaimer, the term of this patent is extended or adjusted under 35 U.S.C. 154(b) by 100 days.

(21) Appl. No.: 16/901,034

(22) Filed: Jun. 15, 2020

(65) Prior Publication Data
US 2021/0282293 A1    Sep. 9, 2021

(30) Foreign Application Priority Data

Mar. 3, 2020 (TW) ................................. 109202364

(51) Int. Cl.
*H05K 7/14* (2006.01)
*H05K 7/18* (2006.01)
*H05K 5/02* (2006.01)

(52) U.S. Cl.
CPC ......... *H05K 7/1491* (2013.01); *H05K 5/0247* (2013.01); *H05K 7/1427* (2013.01); *H05K 7/183* (2013.01)

(58) Field of Classification Search
CPC .. H05K 7/1491; H05K 5/0247; H05K 7/1427; H05K 7/183; H04Q 1/02
See application file for complete search history.

(56) References Cited

U.S. PATENT DOCUMENTS

| | | | | |
|---|---|---|---|---|
| 7,885,505 | B2 * | 2/2011 | Zimmel | G02B 6/3897 385/135 |
| 8,270,798 | B2 * | 9/2012 | Dagley | G02B 6/4452 385/135 |
| 8,433,171 | B2 * | 4/2013 | Cooke | G02B 6/4453 385/135 |
| 9,116,324 | B2 * | 8/2015 | Cooke | G02B 6/4452 |

* cited by examiner

*Primary Examiner* — Robert J Hoffberg
*Assistant Examiner* — Hung Q Dang

(57) ABSTRACT

A modular high density communications chassis including a chassis, pull-out cable management system (POCMS), and at least two or more slidable carrier modules (carrier module (s)) is provided. The carrier modules are slidably mounted to the chassis and POCMS vertically, respectively. The POCMS is assembled to the chassis. In an operational position, ends of the carrier modules of the chassis extend outward from an access mounting opening of the chassis and ends of the carrier modules of the POCMS, alternately neighboring, lie flush with a plane of the access mounting opening. A handle of the POCMS is configured to move the POCMS from the operational position to a cable management position, whereby, the ends of the carrier modules of the POCMS extend past the ends of the carrier modules of the chassis, providing staged access to the carrier modules and staged management of connector cables extending to and therefrom.

17 Claims, 10 Drawing Sheets

MODULAR HIGH DENSITY COMMUNICATIONS CHASSIS

RELATED APPLICATIONS

The application claims the benefit of priority to Taiwan application no. 109202364, filed on Mar. 3, 2020, of which is incorporated herein by reference in its entirety.

TECHNICAL FIELD

Example embodiments relate generally to the field of communications and, more particularly, to high density mounting arrangements for mounting communications equipment to a chassis, the chassis providing cable management and allowing staged access to the equipment.

BACKGROUND

Driven by the ever-growing computing demands of cloud users, generation of massive amounts of data by edge computing devices such as AI-enabled IoT devices, and roll-out of 5G networks, the architectures of hyperscale, colocation and on-premise data centers have rapidly evolved and new data centers closer to end-users or devices have been built as the demand for services that rely on edge data centers increase.

For data centers, whether it's new builds or network upgrades, proper cabling infrastructure is required for successful application delivery within the data centers. The cabling infrastructure must be reliable, easy to install, modular and flexible, to accommodate changes, and scalable to support data center growth. In general, the cabling infrastructure connects the end and intermediate points of traffic patterns within the data centers to and from routers, interconnection switches, access switches, servers, SAN switches and storage.

For installation of connector cables, pre-connectorized cables may be utilized for snap fit connections to high density communications equipment. Generally, the connectors comprise of cables, a connector body, and a coupling device, and the high density communications equipment comprises of racks or frames, chassis', carrier modules and cable management features.

With new data centers being built and existing data centers being upgraded the problem of poor communications equipment access and cable management during installation, maintenance and repair have increased. Often, there are multiple adapters and cable segments connected in a data center, with access to connectors used required not just when deployed, but, several times during deployment. Access and cable management during installation, maintenance and repair of communications equipment may be time-consuming, increase the risk of human error, and in some instances, require special tools for completion. Further, densely packed connections may exacerbate the problems and result in damaged communications equipment or devices, or signals not being transmitted. The problems are further exacerbated for smaller racks or frames.

SUMMARY

Modular high density communications chassis', communications systems, and cable management features for accessing communications equipment and managing cables extending to and/or from the communications equipment in stages are provided.

In an embodiment, a modular high density communications chassis comprising a chassis and a pull-out cable management system assembled to the chassis, both, configured for receiving communications equipment and cable management, and at least two or more slidable carrier modules is provided. The chassis is defined by a first panel, a second panel, and two opposing side panels, forming an access mounting opening, and an equipment opening. The pull-out cable management system is defined by a first cable management panel, a second cable management panel, and two opposing cable management side panels, forming a first mounting opening and a second mounting opening. The pull-out cable management system is assembled to the chassis at the access mounting opening, longitudinally moveable therewith. The chassis comprises a chassis module track system, longitudinal to the two opposing side panels on the first and second panels. The pull-out cable management system comprises at least a handle, a first mounting opening, a cable management module track system, an operational position, and a cable management position. The at least a handle is configured to longitudinally move the pull-out cable management system. The cable management module track system is longitudinal to the two opposing cable management side panels on the first and second cable management panels. The at least two or more slidable carrier modules, each comprise module rails on opposing sides thereof, respectively.

In some embodiments, one of the at least two or more slidable carrier modules is slidably mounted to the chassis via the chassis module track system, and an other of the at least two or more slidable carrier modules is slidably mounted to the pull-out cable management system via the cable management module track system. The at least two or more slidable carrier modules are neighboring, and when the pull-out cable management system is assembled to the chassis in the operational position, an end of one of the at least two or more slidable carrier modules mounted to the chassis extends outward from the access mounting opening and an end of the other of the at least two or more slidable carrier modules mounted to the pull-out cable management system lies flush with a plane of the access mounting opening, and when the pull-out cable management system is assembled to the chassis in the cable management position, the end of one of the at least two or more slidable carrier modules mounted to the chassis remains extending outward from the access mounting opening and the end of the other of the at least two or more slidable carrier modules mounted to the pull-out cable management system extends further outward from the access mounting opening past the end of one of the at least two or more slidable carrier modules mounted to the chassis.

The one of the at least two or more slidable carrier module and the other of the at least two or more slidable carrier module are slidably mounted to the chassis and pull-out cable management system vertically, respectively, longitudinal to the two opposing side panels and two opposing cable management side panels, respectively.

In some embodiments, the pull-out cable management system further comprises opposing longitudinal assembly rails on outer sides of the two opposing cable management side panels, and the chassis further comprises opposing longitudinal tracks, corresponding to the opposing longitudinal assembly rails, on inner sides of the two opposing side panels, at the access mounting opening, for assembly of the pull-out cable management system to the chassis.

In some embodiments, the handle comprises a hooked end opposite the first mounting opening configured for grasping. In some embodiments, the amount of the at least a handle is two.

In some embodiments, the chassis, defined by the first, second, and two opposing side panels further forms a cable management surface extending outward from the first panel and access mounting opening and the chassis further comprises at least a staged fixing system. The at least a staged fixing system is positioned on the cable management surface longitudinal to planes of the two opposing side panels, having an operational fixing recess and a first stage access fixing recess. The first stage access fixing recess is closer to an end of the cable management surface opposite the access mounting opening than the operational fixing recess. A snap fit protrusion of the at least a handle, on an outer side thereof opposite the first mounting opening, is configured to secure and release the pull-out cable management system in and from the operational position when corresponding to the operational fixing recess, and in and from the cable management position when corresponding to the first stage access fixing recess, via lifting and pulling, and lifting and pushing of the at least a handle, respectively.

In some embodiments, the chassis further comprises a positioning protrusion disposed on an edge of the cable management surface, in contact with the at least a handle. The positioning protrusion is configured to assist in preventing the handle from moving further into the first mounting opening when securing the pull-out cable management system in the operational position.

In some embodiments, the at least two or more slidable carrier modules, each further comprise a squeeze-release latching rail mechanism, slidable to the chassis module track system and cable management module track system, respectively, having a squeeze-release portion, configured to secure and release the at least two or more slidable carrier modules to the chassis and pull-out cable management system.

In some embodiments, the chassis module track system further comprises at least a pair of opposing chassis module recesses on the first and second panels, the cable management module track system further comprises at least a pair of opposing cable management module recesses on the first and second cable management panels, and the squeeze-release latching rail mechanism further comprises a latching portion integrated next to the squeeze-release portion, having two corresponding snap fit module protrusions. The snap fit module protrusions is configured to secure and release the at least two or more slidable carrier modules to the at least a pair of opposing chassis module recesses and at least a pair of opposing cable management module recesses, respectively. When the pull-out cable management system is assembled to the chassis in the operational position, the at least a pair of opposing chassis module recesses is closer to the access mounting opening and first mounting opening than the at least a pair of opposing cable management module recesses.

In some embodiments, when releasing the at least two or more slidable carrier modules from the chassis and the pull-out cable management system, respectively, the squeeze-release portions is squeezed together to move the two corresponding snap fit module protrusions of the latching, portion toward each other at a distance greater than a height of the snap fit module protrusions, and then pulled away from the chassis module track, system and cable management module track system, respectively.

In some embodiments, the amount of the at least two or more slidable carrier modules is three or greater, and when the pull-out cable management system is assembled to the chassis in the operational position, the end of one of the at least two or more slidable carrier modules mounted to the chassis extends outward from the access mounting opening, the end of the other of the at least two or more slidable carrier modules mounted to the pull-out cable management system lies flush with a plane of the access mounting opening, the end of a second of the at least two or more slidable carrier modules mounted to the chassis remains extending outward from the access mounting opening, and the end of a second other of the at least two or more slidable carrier modules mounted to the pull-out cable management system lies flush with a plane of the access mounting opening, alternately neighboring, respectively.

In some embodiments, the at least two or more slidable carrier modules, each further comprise at least a connector adapter mounted therein, wherein when the at least two or more slidable carrier modules is mounted to the chassis and pull-out cable management system, respectively, at least a connector is mounted to each of the at least a connector adapters from the access mounting opening and equipment opening, respectively.

In some embodiments, the amount of the at least a connector mounted to each of the at least a connector adapter is six and the amount of the at least two or more slidable carrier modules mounted to the chassis and pull-out cable management system is twelve each.

In some embodiments, the at least a connector adapter is configured to receive the at least a connector in two positions, whereby each position is different by 180 degrees.

In some embodiments, the cable management surface further comprises at least a cable ring assembled near to the end of the cable management surface opposite the access mounting opening, configured for cable management, whereby connector cables are extended therethrough.

In some embodiments, the chassis further comprises at least a cable cylinder assembled near to the equipment opening, configured for cable management, whereby connector cables are extended therethrough.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several examples of modular high density communications chassis' incorporating aspects of the presently disclosed principles are illustrated by way of example, and not by way of limitation.

DETAILED DESCRIPTION

Figure 1:
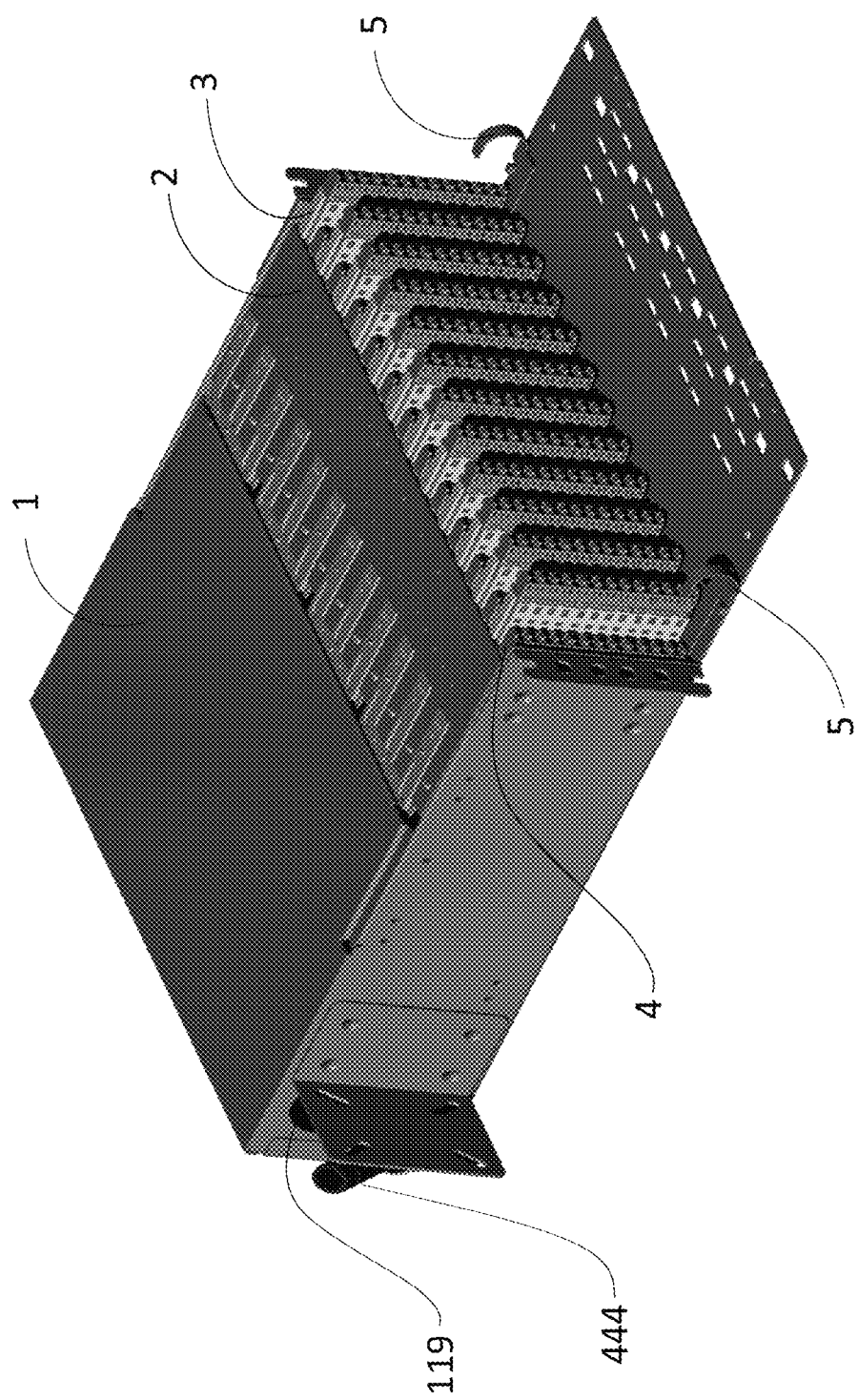
FIG. 1 is a perspective first view of a modular high density communications chassis, according to an example embodiment.

The following describes various principles related to communication systems by way of reference to specific examples of cabling infrastructure, including arrangements and examples of connectors and adapters embodying innovative concepts. More particularly, but not exclusively, such innovative principles are described in relation to selected examples of chassis, carrier modules, and cable rings or hooks, and well-known functions or constructions are be described in detail for purposes of succinctness and clarity. Nonetheless, one or more of the disclosed principles can be incorporated in various other embodiments of chassis, carrier modules, and cable rings or hooks to achieve any of a variety of desired outcomes, characteristics, and/or performance criteria.

Thus, chassis, carrier modules, and cable rings or hooks having attributes that are different from those specific examples discussed herein can embody one or more of the innovative principles, and can be used in applications not described herein in detail. Accordingly, embodiments of chassis, carrier modules, and cable rings or hooks not described herein in detail also fall within the scope of this disclosure, as will be appreciated by those having ordinary skill in the relevant art following a review of this disclosure.

Example embodiments as disclosed herein are directed to modular high density communications chassis. In an embodiment, a chassis, pull-out cable management system, and at least two or more slidable scanner modules is provided. The at least two or more slidable carrier modules are slidably mounted to the chassis and pull-out cable management system vertically, respectively. The pull-out cable management system is assembled to the chassis. In an operational position, ends of the at least two or more slidable carrier modules of the chassis extend outward from an access mounting opening of the chassis and ends of the at least two or more slidable carrier modules of the pull-out cable management system, alternately neighboring, lie flush with a plane of the access mounting opening. A handle of the pull-out cable management system is configured to move the pull-out cable management system from the operational position to a cable management position, whereby, the ends of the at least two or more slidable carrier modules of the pull-out cable management system extend past the ends of the at least two or more slidable carrier modules of the chassis, providing staged access to carrier modules and staged management of connector cables extending to and therefrom.

In same embodiments the modular high density communications chassis may be applicable to, as an example and not to be limiting, communications equipment and patch panels, providing physical connection to networks and devices. The connector types of the modular high density communications chassis of the embodiments may be any suitable connector type known to those having ordinary skill in the relevant art. Those having ordinary skill in the relevant art may also readily appreciate, that the modular high density communications chassis of the embodiments may be stackable vertically, horizontally, or both, and secured by any bracket means known by those skilled in the relevant art or within a rack or frame of communications equipment or panels, and the embodiments are not limited thereto.

Generally, the connectors of the embodiments may be used by commercial businesses, governments, and data centers, transmitting gigabit Ethernet and video multimedia, as an example, and is not limited to any particular type of connector.

The modular high density communications chassis of the embodiments may be separately and/or integrally formed and made of any suitable material known to those having ordinary skill in the relevant art.

Figure 2:
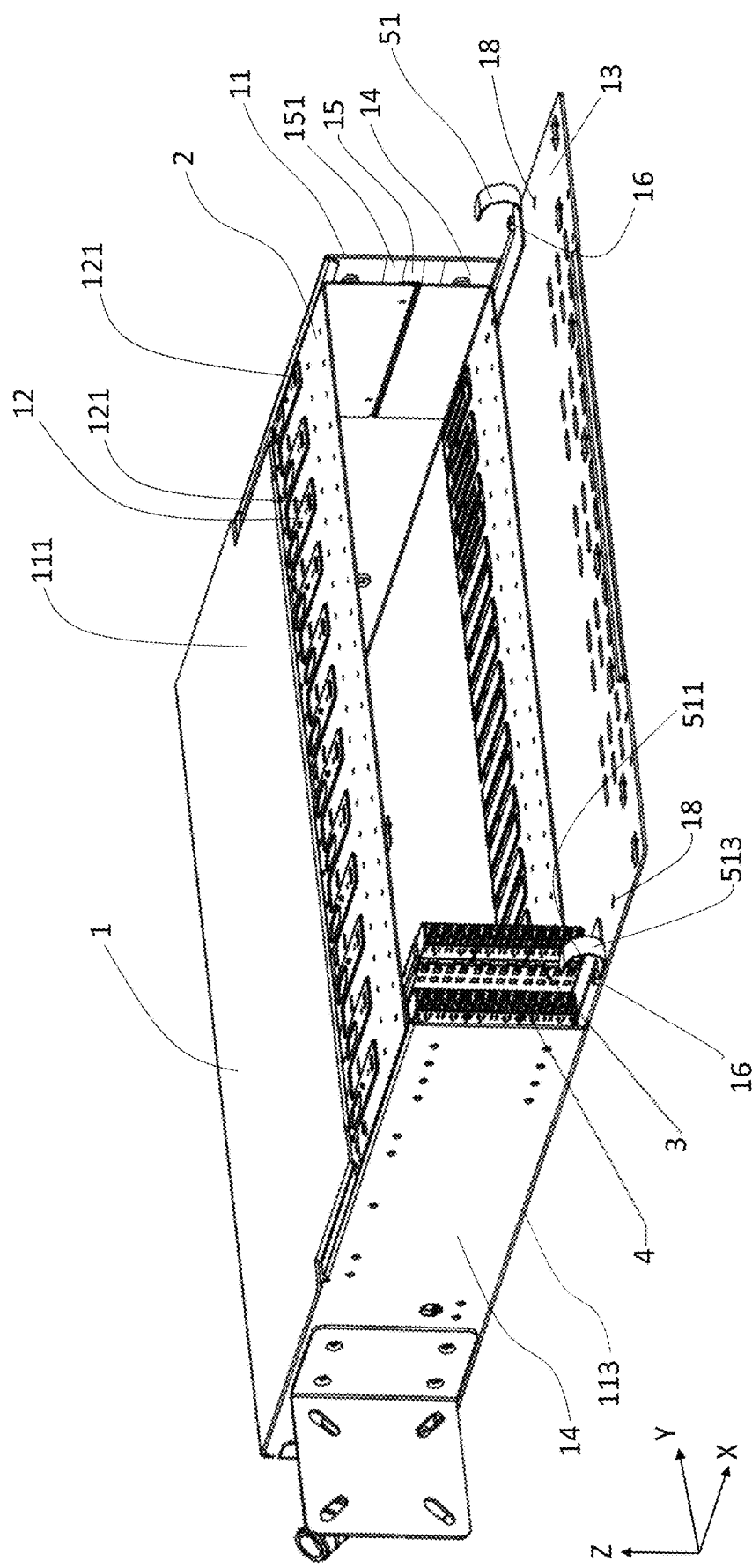
FIG. 2 is a schematic perspective second view of the modular high density communications chassis of FIG. 1 having one slidable carrier module mounted to a chassis and an other slidable carrier module mounted to a pull-out cable management system, according to an example embodiment.
Figure 3:
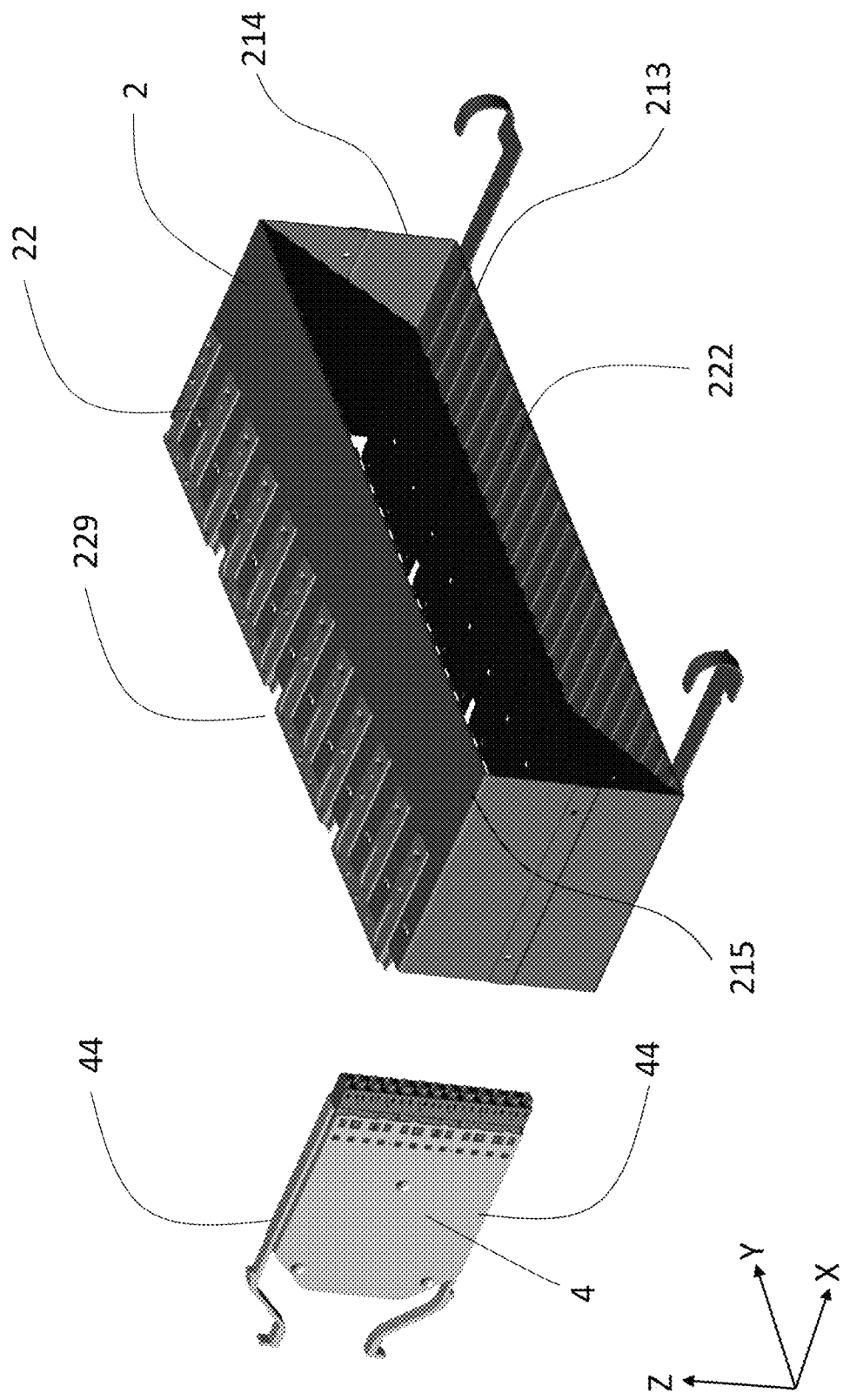
FIG. 3 is a perspective first view of the pull-out cable management system of FIG. 1, according to an example embodiment.

FIG. 1 is a perspective first view of a modular high density communications chassis, according to an example embodiment. FIG. 2 is a schematic perspective second view of the modular high density communications chassis of FIG. 1 having one slidable carrier module mounted to a chassis 1 and an other slidable carrier module mounted to a pull-out cable management system 2, according to an example embodiment. FIG. 3 is a perspective first view of the pull-out cable management system 2 of FIG. 1, according to an example embodiment. Referring to FIGS. 1 to 3, in an embodiment, a modular high density communications chassis comprising a chassis 1 and a pull-out cable management system 2 assembled to the chassis 1, both, configured for receiving communications equipment and cable management, and at least two or more slidable carrier modules 3, 4 is provided. The chassis 1 is defined by a first panel 113, a second panel 111, and two opposing side panels 14, 14, forming an access mounting opening 11, and an equipment opening 119. The pull-out cable management system 2 is defined by a first cable management panel 213, a second cable management panel 215, and two opposing cable management side panels 214, 214, forming a first mounting opening 222 and a second mounting opening 229. The pull-out cable management system 2 is assembled to the chassis 1 at the access mounting opening 11, longitudinally moveable therewith. The chassis 1 comprises a chassis module track system 12, longitudinal to the two opposing side panels 14, 14 on the first and second panels 113, 111. The pull-out cable management system 2 comprises at least a handle 51, a first mounting opening 222, a cable management module track system 22, an operational position, and a cable management position. The at least a handle 51, is configured to longitudinally move the pull-out cable management system 2. In some embodiments, the handle 51 may extend outward from the first cable management panel 213 and first mounting opening 222. The cable management module track system 22 is longitudinal to the two opposing cable management side panels 214, 214 on the first and second cable management panels 213, 215. The at least two or more slidable carrier modules 3, 4, each comprise module rails 44 on opposing sides thereof, respectively.

In some embodiments, the chassis module track system 12 is integrated with the chassis 1 and the cable management module track system 22 is integrated with the pull-out cable management system 2; however, the embodiments are not limited thereto. In some embodiments, the chassis module track system 12 may be separately formed and then assembled to the chassis 1 and/or the cable management module track system 22 may be separately formed and then assembled to the pull-out cable management system 2.

Figure 4:
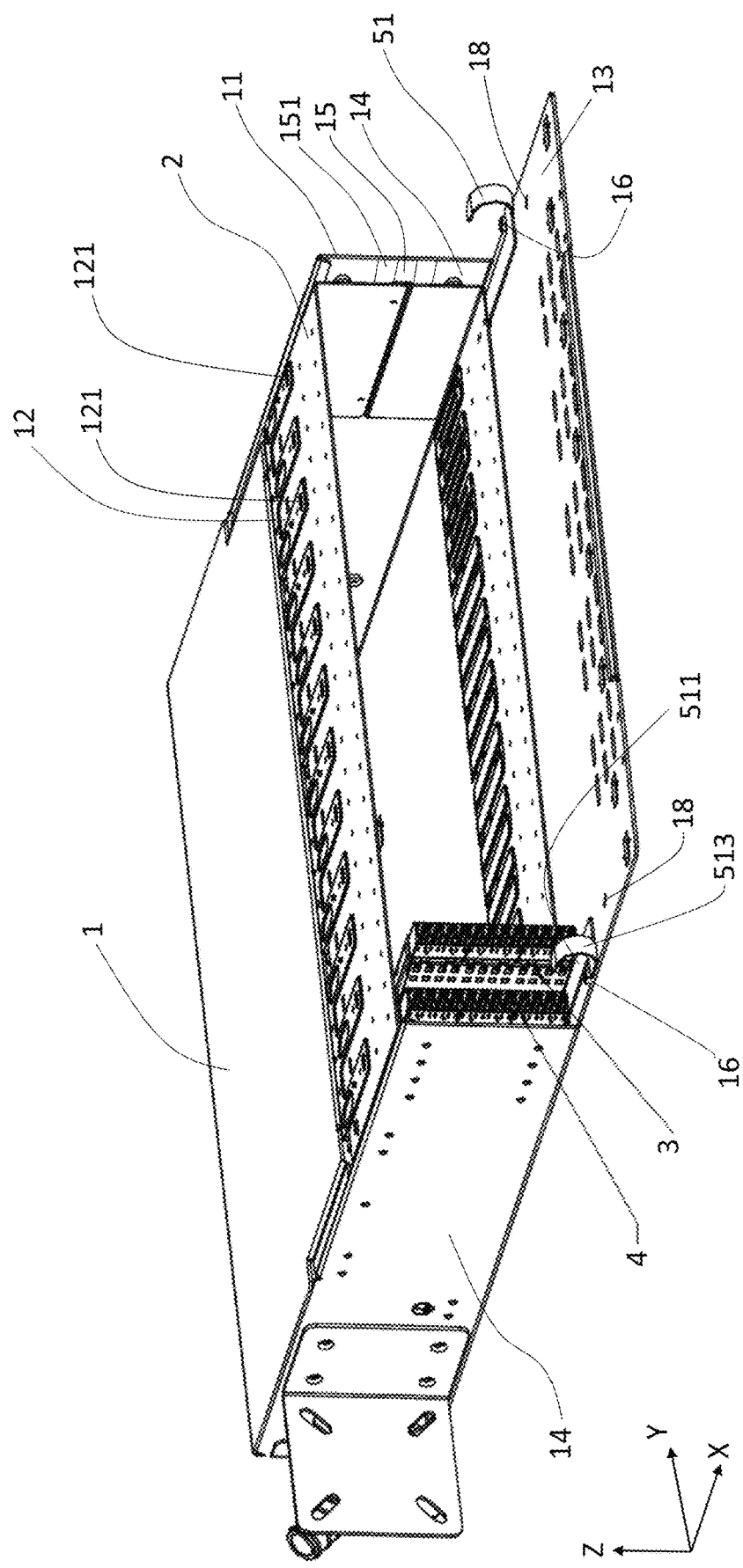
FIG. 4 is a schematic perspective second view of the pull-out cable management system of the modular high density communications chassis of FIG. 2 in an operational position, according to an example embodiment.
Figure 5:
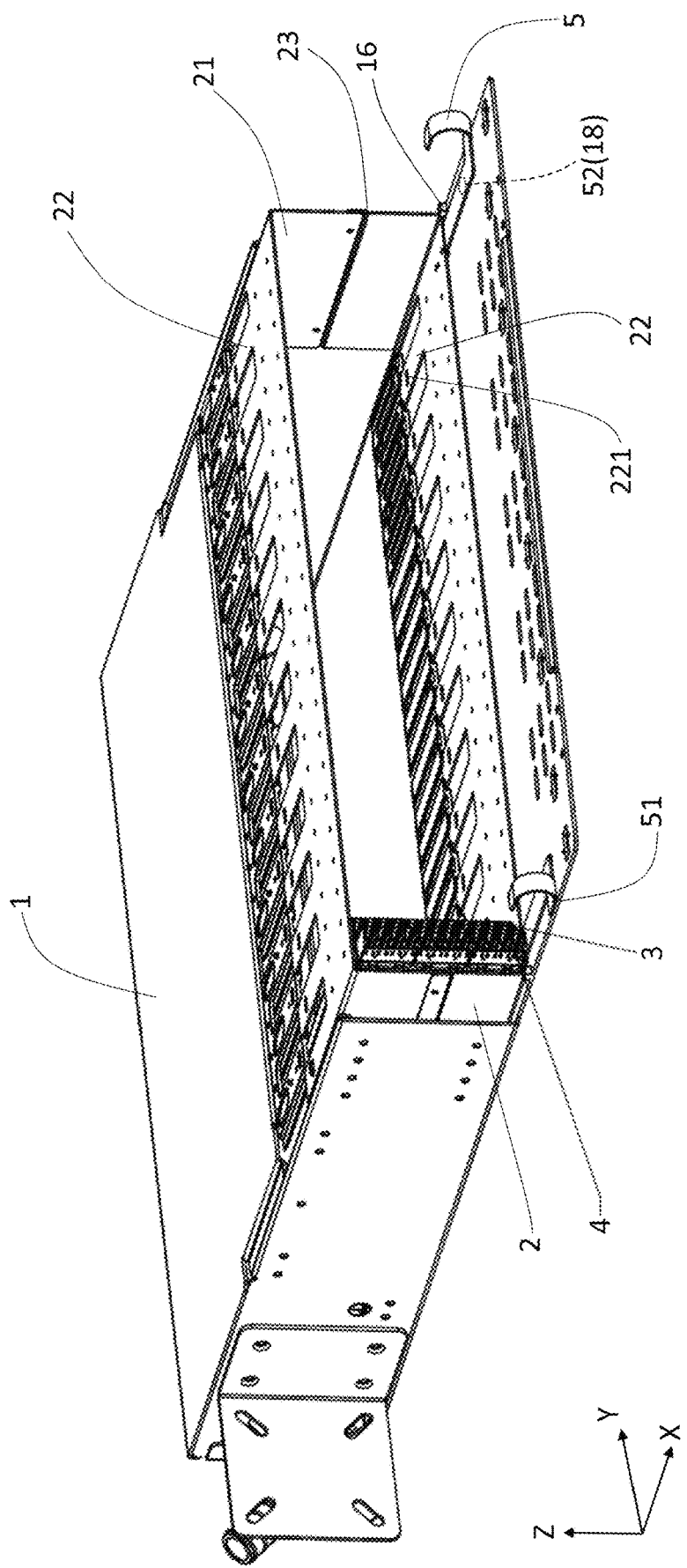
FIG. 5 is a schematic perspective second view of the pull-out cable management system of the modular high density communications chassis of FIG. 2 in a cable management position, according to an example embodiment.

FIG. 4 is a schematic perspective second view of the pull-out cable management system 2 of the modular high density communications chassis of FIG. 2 in an operational position, according to an example embodiment. FIG. 5 is a schematic perspective second view of the pull-out cable management system 2 of the modular high density communications chassis of FIG. 2 in a cable management position, according to an example embodiment. Referring to FIGS. 4 and 5, and referring to FIGS. 1 to 3, in some embodiments, one of the at least two or more slidable carrier modules 3 is slidably mounted to the chassis 1 via the chassis module track system 12, and an other of the at least two or more slidable carrier modules 4 is slidably mounted to the pull-out cable management system 2 via the cable management module track system 22. The at least two or more slidable carrier modules 3, 4 are neighboring, and when the pull-out cable management system 2 is assembled to the chassis 1 in the operational position, an end of one of the at least two or more slidable carrier modules 3 mounted to the chassis 1 extends outward from the access mounting opening 11 and an end of the other of the at least two or more slidable carrier modules 4 mounted to the pull-out cable management system 2 lies flush with a plane of the access mounting opening 11, and when the pull-out cable management system 2 is assembled to the chassis 1 in the cable management position, the end of the at least two or more slidable carrier modules 3 mounted to the chassis 1 remains extending outward from the access mounting opening 11 and the end of the other of the at least two or more slidable carrier modules 4 mounted to the pull-out cable management system 2 extends further outward from the access mounting opening 11 past the end of the at least two or more slidable carrier modules 3 mounted to the chassis 1.

The one of the at least two or more slidable carrier modules 3 and the other of the at least two or more slidable carrier modules 4 are slidably mounted to the chassis 1 and pull-out cable management system 3 vertically, respectively, longitudinal to the two opposing side panels 14, 14 and two opposing cable management side panels 214, 214, respectively. The vertical alignment provides more convenient and less cluttered access to connectors, adapters, and the at least two or more slidable carrier modules 3, 4 as opposed to being horizontal. For horizontal alignment, connectors closer to ground are often covered by connectors further away from ground, providing difficult access.

In some embodiments, the pull-out cable management system 2 further comprises opposing longitudinal assembly rails 23, 23 on outer sides of the two opposing cable management side panels 214, 214, and the chassis 1 further comprises opposing longitudinal tracks 15, 15, corresponding to the opposing longitudinal assembly rails 23, 23, on inner sides of the two opposing side panels 14, 14, at the access mounting opening 11, for assembly of the pull-out cable management system 2 to the chassis 1.

In some embodiments, the at least a handle 51 comprises a hooked end 513 opposite the first mounting opening 222 configured for grasping. In some embodiments, the amount of the at least a handle 51 is two.

In some embodiments, the chassis 1, defined by the first 113, second 111, and two opposing side panels 14, 14 further forms a cable management surface 13 extending outward from the first panel 113 and access mounting opening 11 and the chassis 1 further comprises at least a staged fixing system 20. The at least a staged fixing system 20 is positioned on the cable management surface 13 longitudinal to planes of the two opposing side panels 14, 14, having an operational fixing recess 17 and a first stage access fixing recess 18. The first stage access fixing recess 18 is closer to an end of the cable management surface 13 opposite the access mounting opening 11 than the operational fixing recess 17.

A snap fit protrusion 52 of the at least a handle 51, on an outer side thereof opposite the first mounting opening 222 is configured to secure and release the pull-out cable management system 2 in and from the operational position when corresponding to the operational fixing recess 17, and in and from the cable management position when corresponding to the first stage access fixing recess 18, via lifting and pulling and lifting and pushing of the at least a handle 51, respectively. The at least a handle 51 is configured for bending to at least a distance of the height of the snap fit protrusion 52, before snapping back to being parallel with the first cable management panel 213, whereby the snap fit protrusion 52 is within the operational fixing recess 17 or first stage access fixing recess 18.

In the embodiments, the at least a handle 51 comprises the snap fit protrusion 52 and the chassis 1 comprises the operational fixing recess 17 and first stage access fixing recess 18; however the embodiments are not limited thereto. In some embodiments, the chassis may comprise two protrusions and the handle may comprise an opening. As long as the pull-out cable management system 2 can be secured and released in and from the operational position, and in and from the cable management position, via lifting and pulling and lifting and pushing of the at least a handle 51, respectively.

In some embodiments, the chassis 1 further comprises a positioning protrusion 16 disposed on an edge of the cable management surface 13, in contact with a side extension of the at least a handle 51. The positioning protrusion 16 is configured to assist in preventing the at least a handle 51 from moving further into the first mounting opening 222 when securing the pull-out cable management system 2 in the operational position.

Figure 6:
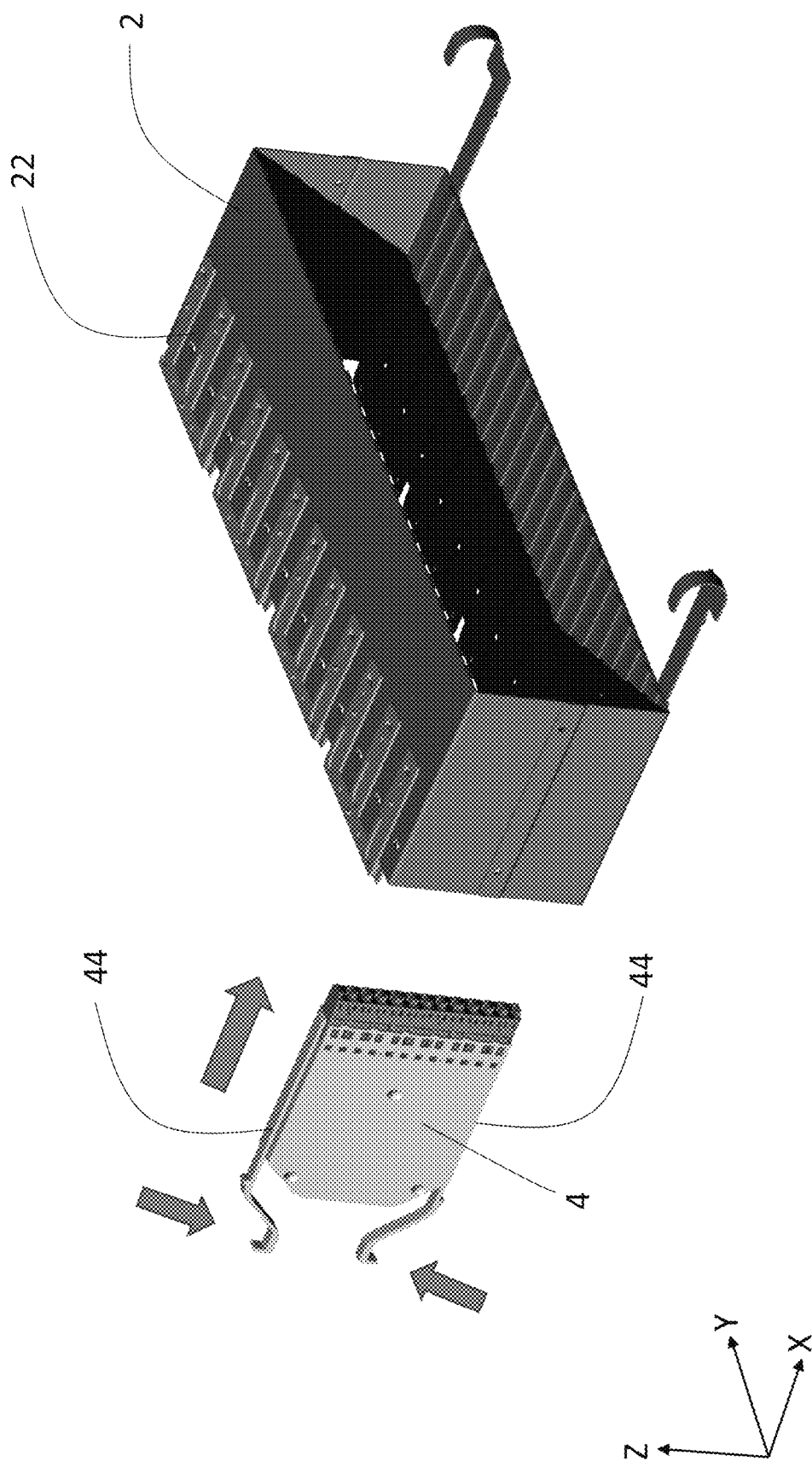
FIG. 6 is a schematic perspective first view of the pull-out cable management system of FIG. 3 and a slidable carrier module, according to an example embodiment.
Figure 7:
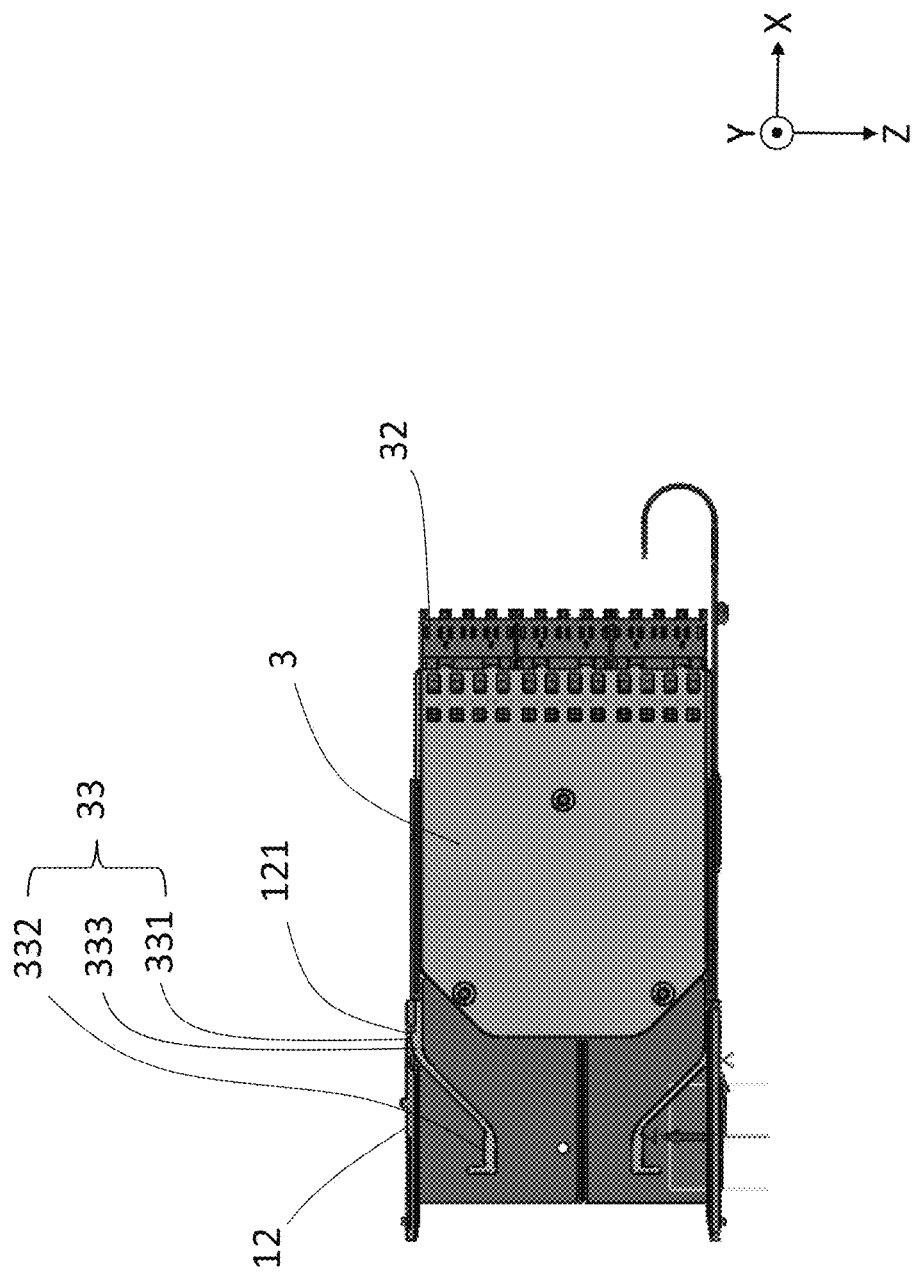
FIG. 7 is a perspective third view of a slidable carrier module assembled to a chassis module track system of FIG. 1, according to an example embodiment.
Figure 8:
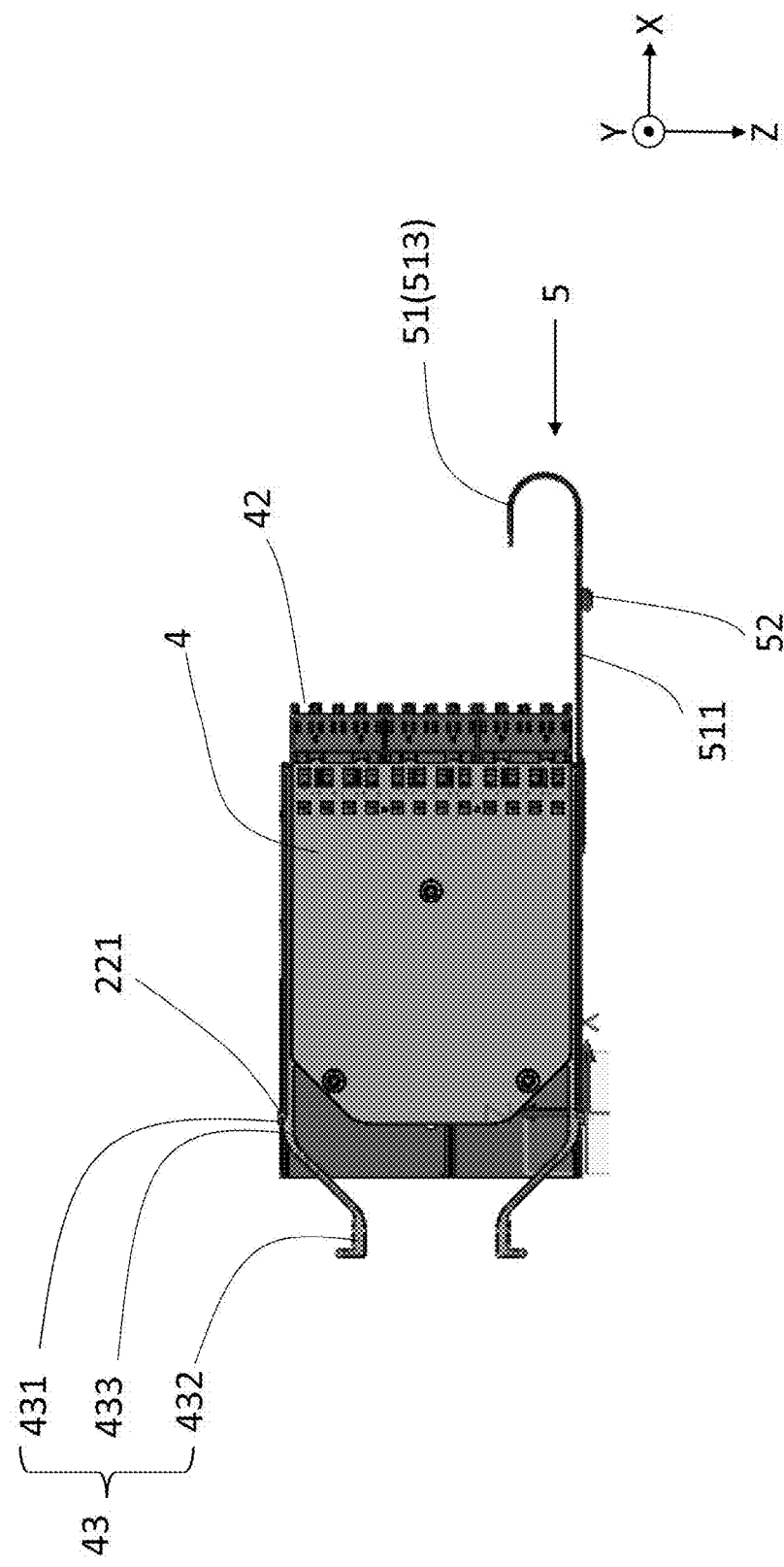
FIG. 8 is a perspective third view of a slidable carrier module assembled to a cable management module track system of FIG. 1, according to an example embodiment.

FIG. 6 is a schematic perspective first view of the pull-out cable management system 2 of FIG. 3 and a slidable carrier module, according to an example embodiment. FIG. 7 is a perspective third view of a slidable carrier module assembled to a chassis module track system 12 of FIG. 1, according to an example embodiment. FIG. 8 is a perspective third view of a slidable carrier module assembled to a cable management module track system 22 of FIG. 1, according to an example embodiment. Referring to FIGS. 6 to 8, and referring to FIGS. 1 to 5, in some embodiments, the at least two or more slidable carrier modules 3, 4, each further comprise a squeeze-release latching rail mechanism 33, 43, slidable to the chassis module track system 12 and cable management module track system 22, respectively, having a squeeze-release portions 332, 432, configured to secure and release the at least two or more slidable carrier modules 3, 4 to the chassis 1 and pull-out cable management system 2.

In some embodiments, the chassis module track system 12 further comprises at least a pair of opposing chassis module recesses 121, 121 on the first and second panels 113, 111, the cable management module track system 22 further comprises at least a pair of opposing cable management module recesses 221, 221 on the first and second cable management panels 213, 215, and the squeeze-release latching rail mechanism 33, 43 further comprises a latching portion 333, 433 integrated next to the squeeze-release portions 332, 432 having two corresponding snap fit module protrusions 331, 431. The snap fit module protrusions 331, 331, 231, 231 is configured to secure and release the at least two or more slidable carrier modules 3, 4 to the at least a pair of opposing chassis module recesses 121, 121 and at least a pair of opposing cable management module recesses 221, 221, respectively. When the pull-out cable management system 2 is assembled to the chassis 1 in the operational position, the at least a pair of opposing chassis module recesses 121, 121 is closer to the access mounting opening 11 and first mounting opening 222 than the at least a pair of opposing cable management module recesses 221, 221.

In some embodiments, when releasing the at least two or more slidable carrier modules 3, 4 from the chassis 1 and the pull-out cable management system 2, respectively, the squeeze-release portions 332, 432 is squeezed together to move the two corresponding snap fit module protrusions 331, 431 of the latching portion 333, 433 toward each other at a distance greater than a height of the snap fit module protrusions 331, 431 and then pulled away from the chassis module track system 12 and cable management module track system 22, respectively.

Figure 9:
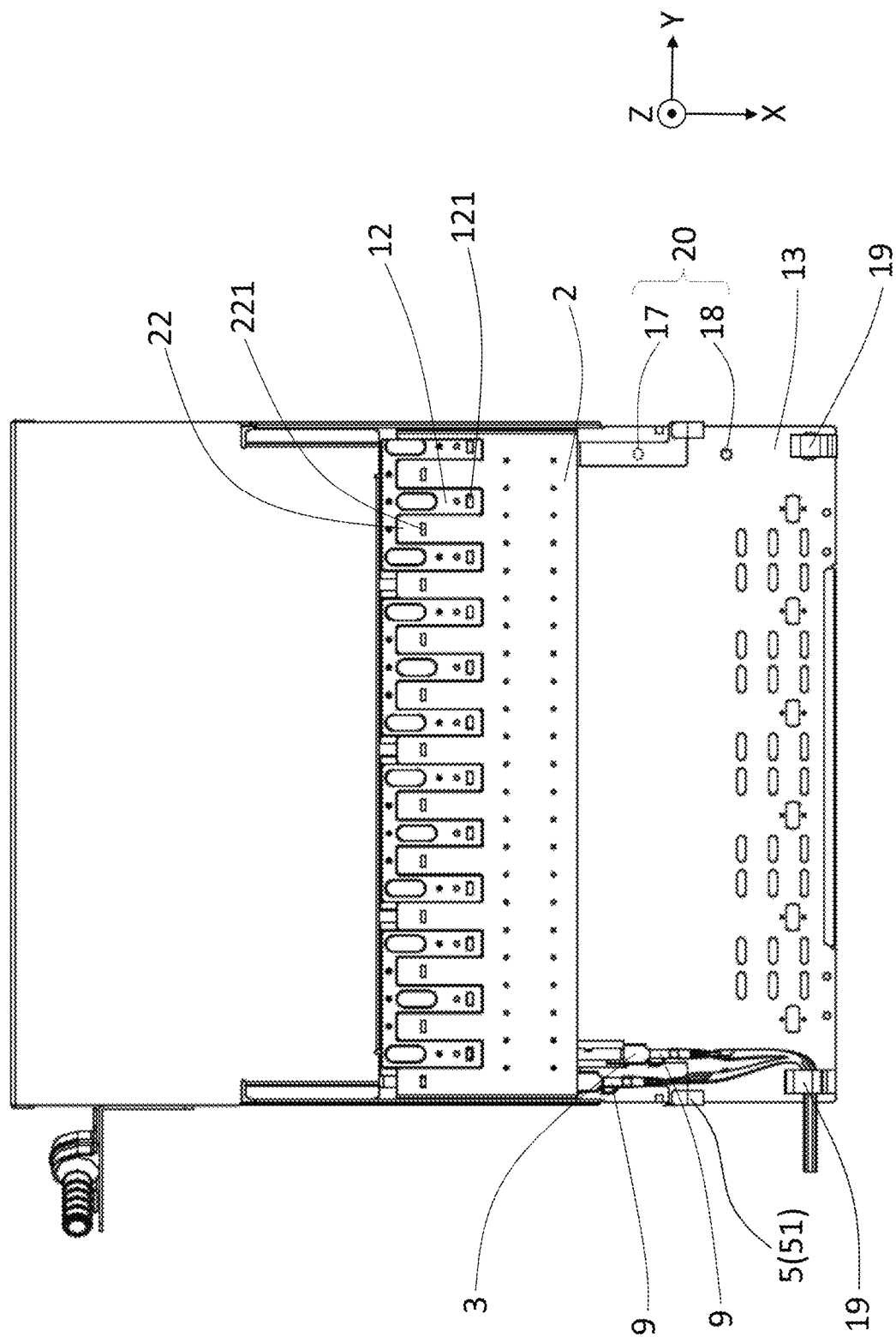
FIG. 9 is a schematic perspective fourth view of the pull-out cable management system of the modular high density communications chassis of FIG. 4 in the operational position, according to an example embodiment.
Figure 10:
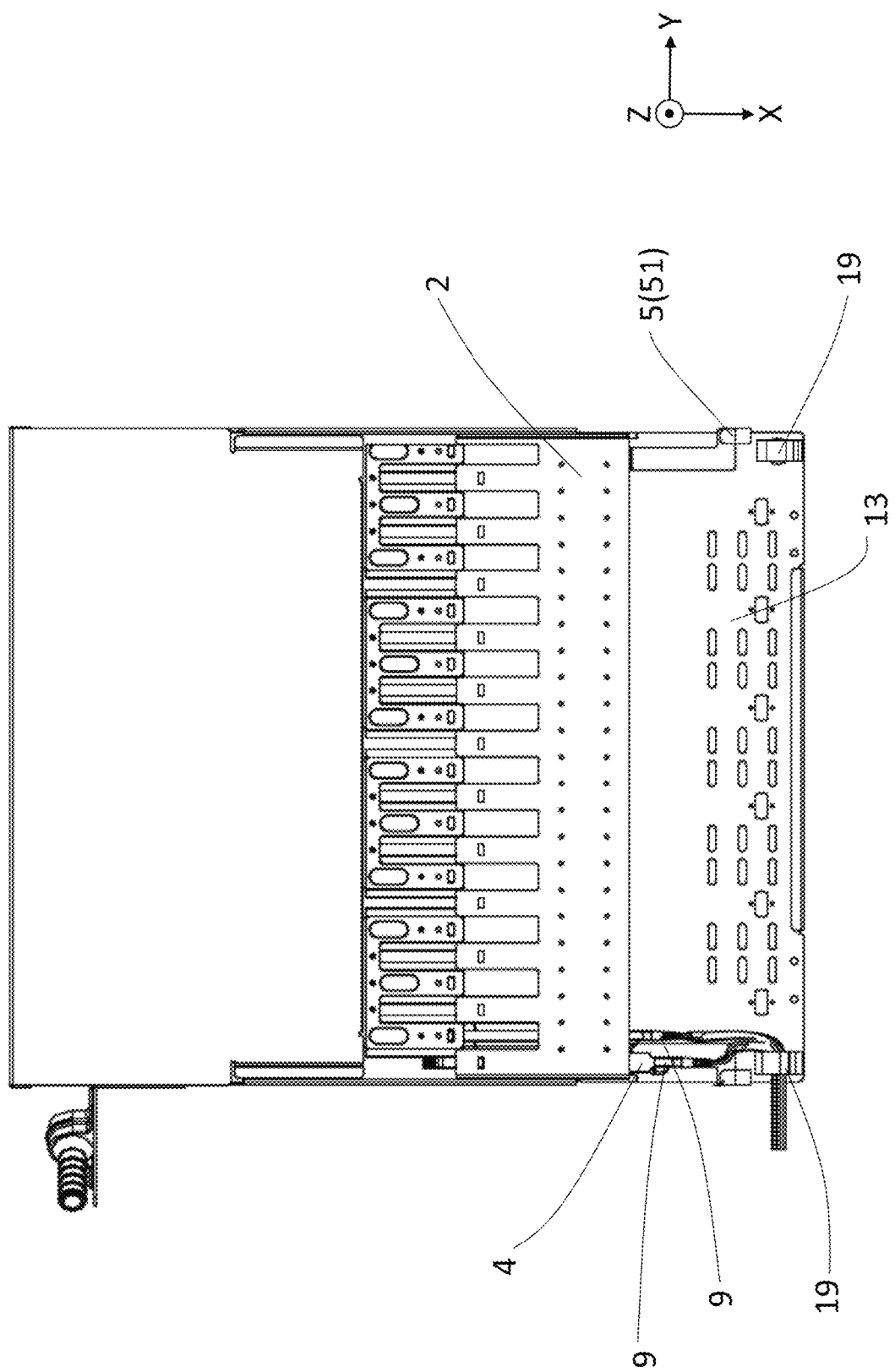
FIG. 10 is a schematic perspective fourth view of the pull-out cable management system of the modular high density communications chassis of FIG. 5 in the cable management position, according to an example embodiment.

FIG. 9 is a schematic perspective fourth view of the pull-out cable management system 2 of the modular high density communications chassis of FIG. 4 in the operational position, according to an example embodiment. FIG. 10 is a schematic perspective fourth view of the pull-out cable management system 2 of the modular high density communications chassis of FIG. 5 in the cable management position, according to an example embodiment. Referring to FIGS. 9 to 11 and referring to FIGS. 1 to 8, in some embodiments, the amount of the at least two or more slidable carrier modules 3, 4 is three or greater, and when the pull-out cable management system 2 is assembled to the chassis 1 in the operational position, the end of one of the at least two or more slidable carrier modules 3 mounted to the chassis 1 extends outward from the access mounting opening 11, the end of the other of the at least two or more slidable carrier modules 4 mounted to the pull-out cable management system 2 lies flush with a plane of the access mounting opening 11, the end of a second of the at least two or more slidable carrier modules 3 mounted to the chassis 1 remains extending outward from the access mounting opening 11, and the end of a second other of the at least two or more slidable carrier modules 4 mounted to the pull-out cable management system 2 lies flush with a plane of the access mounting opening 11, alternately neighboring, respectively.

In some embodiments, the at least two or more slidable carrier modules 3, 4, each further comprise at least a connector adapter 32, 42 mounted therein, wherein when the at least two or more slidable carrier modules 3, 4 is mounted to the chassis 1 and pull-out cable management system 2, respectively, at least a connector 9, 9 is mounted to each of the at least a connector adapters 32, 42 from the access mounting opening 11 and equipment opening 119, respectively.

In some embodiments, the second panel 111 of the chassis 1 may be removed for mounting, maintenance and/or repair of the at least a connector adapter 32, 42 mounted to the at least two or more slidable carrier modules 3, 4 of the chassis 1 and pull-out cable management system 2.

In some embodiments, the amount of the at least a connector 9, 9 mounted to each of the at least a connector adapter 32, 42 is six and the amount of the at least two or more slidable carrier modules 3, 4 mounted to the chassis 1 and pull-out cable management system 2 is twelve each.

In some embodiments, the at least a connector adapter 32, 42 is configured to receive the at least a connector 9, 9 in two positions, whereby each position is different by 180 degrees.

In some embodiments, the cable management surface 13 further comprises at least a cable ring 19, 19 assembled near to the end of the cable management surface 13 opposite the access mounting opening 11 configured for cable management, whereby connector cables are extended therethrough.

In some embodiments, the chassis 1 further comprises at least a cable cylinder 444 assembled near to the equipment opening 119, configured for cable management, whereby connector cables are extended therethrough.

The cable management of the embodiments, for example, the cable ring clip 19 of the cable management surface 13, is configured such that any cable slack during the forward and rearward slidable movements of the pull-out cable management system 2 is accommodated. Also, in the embodiments, the cable ring clip is ring-shaped, however, the embodiments are not limited thereto. The cable ring clip may be any suitable ring, clip, or hook, etc. known to those having ordinary skill in the art, as long as cables may be extended therethrough.

The rails and tracks of the modular high density communications chassis of the embodiments may be any suitable rail and track known to those having ordinary skill in the art and may be configured in any suitable manner known to those having ordinary skill in the art. As long as slidable movement and/or a mounting feature is present.

The exploding demand for data volumes and data rates have resulted in existing data centers being upgraded and new data centers begin built. Often, there are multiple adapters and cable segments connected in a data center, with the polarity of the connectors used changing not just when, but, several times during deployment. The problem of poor communications equipment access and cable management during installation, maintenance and repair has increased. Often, there are multiple adapters and cable segments connected in a data center, with access to connectors required not just when, but, several, times during deployment. Access and cable management during installation, maintenance and repair of communications equipment may be time-consuming, increase the risk of human error, and in some instances, require special tools for completion. Further, densely packed connections may exacerbate the problem and result in damaged communications equipment or devices, or signals not being transmitted.

In the embodiments, modular high density communications chassis, comprising a chassis, pull-out cable management system, and at least two or more slidable carrier modules is provided. The at least two or more slidable carrier modules are slidably mounted to the chassis and pull-out cable management system vertically, respectively. The pull-out cable management system is assembled to the chassis. In an operational position, ends of the at least two or more slidable carrier modules of the chassis extend outward from an access mounting opening of the chassis and ends of the at least two or more slidable carrier modules of the pull-out cable management system, alternately neighboring, lie flush with a plane of the access mounting opening. A handle of the pull-out cable management system is configured to move the pull-out cable management system from the operational position to a cable management position, whereby, the ends of the at least two or more slidable carrier modules of the pull-out cable management system extend past the ends of the at least two or more slidable carrier modules of the chassis, providing staged access to carrier modules and staged management of connector cables extending to and therefrom.

The embodiments of the modular high density communications chassis allow for cabling infrastructure in data centers, as an example, to be even more reliable, easier to install, modular and flexible, to accommodate changes, data center growth, and increased cable densities in same footprints. When access to communications equipment used is required a handle is employed to extend the at least two or more slidable carrier modules of the pull-out cable management system outward for installation, maintenance and repair. The combination of the alternately neighboring at least two or more slidable carrier modules of the chassis and pull-out cable management system, operational and first stage access fixing recesses, and handle allow alternating staged access of the at least two or more slidable carrier modules of the chassis and pull-out cable management system, respectively, to alternating accessible positions for greater convenience of technicians. The alternating accessible positions form a larger space on at least a side of the at least two or more slidable carrier modules for easier access. The at least two or more slidable carrier modules is pushed and pulled to a desired position. Thus, time is saved, risk of human error is mitigated, and no special tool is required for completion. Via vertical alignment of the at least two or more slidable carrier modules and convenient installation of hooks, clips, or rings to the chassis, cable management of cables extending to and/or from the modular high density communications chassis of the embodiments is simplified, decreasing clutter, and increasing access to connection locations of communications equipment. Also, the exacerbated problems, especially for smaller racks or frames for 1 U or 2 U panels, are reduced.

The presently disclosed inventive concepts are not intended to be limited to the embodiments shown herein, but are to be accorded their full scope consistent with the principles underlying the disclosed concepts herein. Directions and references to an element, such as "up", "down", "upper," "lower," "horizontal," "vertical," "left," "right," and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless specifically so stated. Reference to an element in the singular, such as by use of the article "a" or "an", is not intended to mean "one and only one" unless specifically so stated, but rather "one or more". As used herein, "and/or" means "and" or "or", as well as "and" and "or." As used herein, ranges and subranges mean all ranges including whole and/or fractional values therein and language which defines or modifies ranges and subranges, such as "at least," "greater than," "less than," "no more than," and the like, mean subranges and/or an upper or lower limit. All structural and functional equivalents to the elements of the various embodiments described throughout the disclosure that are known or later come to be known to those having ordinary skill in the relevant art are intended to be encompassed by the features described and claimed herein. Moreover, nothing disclosed herein is intended to be dedicated to the public regardless of whether such disclosure may ultimately explicitly be recited in the claims. No element or concept disclosed herein or hereafter presented shall be construed under the provisions of 35 USC 112(f) unless the element or concept is expressly recited using the phrase "means for" or "step for".

In view of the many possible embodiments to which the disclosed principles can be applied, we reserve the right to claim any and all combinations of features and acts described herein, including the right to claim all that comes within the scope and spirit of the foregoing description, as well as the combinations recited, literally and equivalently, in the following claims and any claims presented anytime throughout prosecution of this application or any application claiming benefit of or priority from this application.

What is claimed is:

1. A modular high density communications chassis, comprising:
    a chassis configured for receiving communications equipment and cable management, defined by a first panel, a second panel, and two opposing side panels, forming an access mounting opening, comprising:
        a chassis module track system, longitudinal to the two opposing side panels on the first and second panels; and
    a pull-out cable management system assembled to the chassis at the access mounting opening, longitudinally moveable therewith, configured for receiving the communications equipment and the cable management, defined by a first cable management panel, a second cable management panel, and two opposing cable management side panels, forming a first mounting opening and a second mounting opening, comprising:
        at least a handle, configured to longitudinally move the pull-out cable management system;
        a cable management module track system longitudinal to the two opposing cable management side panels on the first and second cable management panels;
        an operational position; and
        a cable management position; and
    at least two or more slidable carrier modules, each comprising module rails on opposing sides thereof, respectively,
    wherein one of the at least two or more slidable carrier modules is slidably mounted to the chassis via the chassis module track system, and an other of the at least two or more slidable carrier modules is slidably mounted to the pull-out cable management system via the cable management module track system, whereby the at least two or more slidable carrier modules are neighboring, and when the pull-out cable management system is assembled to the chassis in the operational position, an end of one of the at least two or more slidable carrier modules mounted to the chassis extends outward from the access mounting opening and an end of the other of the at least two or more slidable carrier modules mounted to the pull-out cable management system lies flush with a plane of the access mounting opening, and when the pull-out cable management system is assembled to the chassis in the cable management position, the end of one of the at least two or more slidable carrier modules mounted to the chassis remains extending outward from the access mounting opening and the end of the other of the at least two or more slidable carrier modules mounted to the pull-out cable management system extends further outward from the access mounting opening past the end of one of the at least two or more slidable carrier modules mounted to the chassis.

2. The modular high density communications chassis of claim 1, wherein the chassis, defined by the first, second, and two opposing side panels further forms a cable management surface extending outward from the first panel and access mounting opening, further comprises:
   at least a staged fixing system, positioned on the cable management surface longitudinal to planes of the two opposing side panels, having an operational fixing recess and a first stage access fixing recess,
   whereby the first stage access fixing recess is closer to an end of the cable management surface opposite the access mounting opening than the operational fixing recess, and
   whereby a snap fit protrusion of the at least a handle, on an outer side thereof opposite the first mounting opening, is configured to secure and release the pull-out cable management system in and from the operational position when corresponding to the operational fixing recess, and in and from the cable management position when corresponding to the first stage access fixing recess, via lifting and pulling and lifting and pushing of the at least a handle, respectively.

3. The modular high density communications chassis of claim 2, wherein the chassis further comprises a positioning protrusion disposed on an edge of the cable management surface, in contact with the at least a handle, configured to assist in preventing the handle from moving further into the first mounting opening when securing the pull-out cable management system in the operational position.

4. The modular high density communications chassis of claim 1, wherein the pull-out cable management system further comprises opposing longitudinal assembly rails on outer sides of the two opposing cable management side panels, and the chassis further comprises opposing longitudinal tracks, corresponding to the opposing longitudinal assembly rails, on inner sides of the two opposing side panels, at the access mounting opening, for assembly of the pull-out cable management system to the chassis.

5. The modular high density communications chassis of claim 1, wherein the at least two or more slidable carrier modules, each further comprise a squeeze-release latching rail mechanism, slidable to the chassis module track system and cable management module track system, respectively, having a squeeze-release portion, configured to secure and release the at least two or more slidable carrier modules to the chassis and pull-out cable management system.

6. The modular high density communications chassis of claim 5, wherein the chassis module track system further comprises at least a pair of opposing chassis module recesses on the first and second panels, the cable management module track system further comprises at least a pair of opposing cable management module recesses on the first and second cable management panels, and the squeeze-release latching rail mechanism further comprises a latching portion integrated next to the squeeze-release portion, having two corresponding snap fit module protrusions, whereby the snap fit module protrusions is configured to secure and release the at least two or more slidable carrier modules to the at least a pair of opposing chassis module recesses and at least a pair of opposing cable management module recesses, respectively, and when the pull-out cable management system is assembled to the chassis in the operational position, the at least a pair of opposing chassis module recesses is closer to the access mounting opening and first mounting opening than the at least a pair of opposing cable management module recesses.

7. The modular high density communications chassis of claim 6, wherein when releasing the at least two or more slidable carrier modules from the chassis and the pull-out cable management system, respectively, the squeeze-release portions is squeezed together to move the two corresponding snap fit module protrusions of the latching portion toward each other at a distance greater than a height of the snap fit module protrusions, and then pulled away from the chassis module track system and cable management module track system, respectively.

8. The modular high density communications chassis of claim 1, wherein the handle comprises a hooked end opposite the first mounting opening configured for grasping.

9. The modular high density communications chassis of claim 1, wherein the one of the at least two or more slidable carrier module and the other of the at least two or more slidable carrier module are slidably mounted to the chassis and pull-out cable management system vertically, respectively, longitudinal to the two opposing side panels and two opposing cable management side panels, respectively.

10. The modular high density communications chassis of claim 1, wherein the amount of the at least two or more slidable carrier modules is three or greater, and when the pull-out cable management system is assembled to the chassis in the operational position, the end of one of the at least two or more slidable carrier modules mounted to the chassis extends outward from the access mounting opening, the end of the other of the at least two or more slidable carrier modules mounted to the pull-out cable management system lies flush with a plane of the access mounting opening, the end of a second of the at least two or more slidable carrier modules mounted to the chassis remains extending outward from the access mounting opening, and the end of a second other of the at least two or more slidable carrier modules mounted to the pull-out cable management system lies flush with a plane of the access mounting opening, alternately neighboring, respectively.

11. The modular high density communications chassis of claim 1, wherein the amount of the at least a handle is two.

12. The modular high density communications chassis of claim 1, wherein the at least two or more slidable carrier modules, each further comprise at least a connector adapter mounted therein, wherein when the at least two or more slidable carrier modules is mounted to the chassis and pull-out cable management system, respectively, at least a connector is mounted to each of the at least a connector adapters from the access mounting opening and an equipment opening of the chassis, respectively.

13. The modular high density communications chassis of claim 12, wherein the amount of the at least a connector mounted to each of the at least a connector adapter is six and the amount of the at least two or more slidable carrier modules mounted to the chassis and pull-out cable management system is twelve each.

14. The modular high density communications chassis of claim 12, wherein the at least a connector adapter is configured to receive the at least a connector in two positions, whereby each position is different by 180 degrees.

15. The modular high density communications chassis of claim 14, wherein the amount of the at least a connector mounted to each of the at least a connector adapter configured to receive the at least a connector in two positions is six and the amount of the at least two or more slidable carrier modules mounted to the chassis and pull-out cable management system is twelve each.

16. The modular high density communications chassis of claim 2, wherein the cable management surface further comprises at least a cable ring assembled near to the end of the cable management surface opposite the access mounting opening, configured for cable management, whereby connector cables are extended therethrough.

17. The modular high density communications chassis of claim 1, wherein the chassis further comprises at least a cable cylinder assembled near to an equipment opening of the chassis, configured for cable management, whereby connector cables are extended therethrough.

* * * * *